United States Patent [19]
Fuke et al.

[11] Patent Number: 5,827,035
[45] Date of Patent: Oct. 27, 1998

[54] LEAD FRAME PUSHER DEVICE

[75] Inventors: Shigeru Fuke, Musashino; Eiji Kikuchi, Musashimurayama, both of Japan

[73] Assignee: Kabushiki Kaisha Shinkawa, Tokyo, Japan

[21] Appl. No.: 691,543

[22] Filed: Aug. 2, 1996

[30] Foreign Application Priority Data

Aug. 4, 1995 [JP] Japan .................................... 7-218342

[51] Int. Cl.$^6$ .................................................. B65G 1/06
[52] U.S. Cl. ...................... 414/417; 198/168.11; 414/331
[58] Field of Search .................................... 414/416, 417, 414/331; 198/168.11

[56] References Cited

U.S. PATENT DOCUMENTS 4,457,662  7/1984  Ireland et al. ........................... 414/331
5,435,681  7/1995  Ueda .......................................... 414/19

FOREIGN PATENT DOCUMENTS

197342     9/1986  Japan ................................. 198/168.11
5-130946   5/1995  Japan .

*Primary Examiner*—Thomas J. Brahan
*Attorney, Agent, or Firm*—Koda & Androlia

[57] ABSTRACT

A lead frame pusher device for feeding lead frames in and out of a lead frame magazine including: a pusher mount installed between a pair of lead frame supply guide rails so that the pusher mount can travel along the supply guide rails, a pusher driver which moves the pusher mount along the supply guide rails, a first pusher fastened to the pusher mount so as to project upward from the pusher mount, a second pusher fastened to the pusher mount so as to be located below the first pusher and extends toward the magazine, and a pusher driver for vertically moving the pusher mount so that the first and second pushers are moved to a lead frame conveying path level of the lead frame supply guide rails.

10 Claims, 5 Drawing Sheets

LEAD FRAME PUSHER DEVICE

BACKGROUND OF THE INVENTION

1. Field of the Invention

The present invention relates to a lead frame pusher device which feeds lead frames into a lead frame magazine that is raised and lowered by an elevator device and then subsequently feeds the lead frames out of the lead frame magazine.

2. Prior Art

The baking oven described in Japanese Patent Application Laid-Open (Kokai) No. 7-130946 is an example of a conventional system in which lead frames are fed into a lead frame magazine (called "magazine") by a pusher of a pusher device and then subsequently fed out of the magazine by the pusher.

In this device, in order to feed the lead frames into the magazine, the pusher must operate so as to move a distance which is at least equal to the length of the lead frame to be handled and a distance from the front end of the lead frame to the rear end of the magazine. Furthermore, in order to feed the lead frames out of the magazine, the pusher must be operated to move a distance which is at least equal to the distance from the rear end of the magazine to the front end of the magazine.

In the prior art described above, when the lead frames are fed into and out of the magazine, the pusher must be moved a distance which is at least equal to the length of the lead frames in the magazine plus the feed-out distance of the lead frames from the magazine. As a result, the size of the pusher device tends to be large, and considerable time is required for the movement of the pusher.

SUMMARY OF THE INVENTION

Accordingly, the object of the present invention is to provide a lead frame pusher device which allows the size of the pusher device to be reduced and the movement time of the pusher to be shortened.

The object is accomplished by a unique structure of the present invention for a lead frame pusher device in which lead frame supply and discharge guide rails are installed respectively on the front and back of a magazine which is raised and lowered by an elevator device so that lead frames are fed into and out of the magazine, and the unique structure of the present invention is that the pusher device further includes:

- a pusher mount installed on the supply guide rails so that the pusher mount can move along the supply guide rails,
- a pusher mount driving means which moves the pusher mount along the supply guide rails,
- a first pusher fastened to the pusher mount and projects upward from the pusher mount,
- a second pusher fastened to the pusher mount so as to be below the first pusher and extends toward the magazine, and
- a pusher raising and lowering driving means which moves the pusher mount up and down so that the first and second pushers are positioned at the conveying path level of the supply guide rails.

The above-described pusher device may include a feeding roller means on the supply guide rails so as to further smoothly feed the lead frames into the magazine in a sandwiched fashion.

The above-described pusher device may further include a feeding roller means on the discharge guide rails so as to feed out the lead frames in a sandwiched fashion.

In addition, the above-described pusher device may include feeding roller means on the supply guide rails and on the discharge guide rails so as to feed the lead frames in a sandwiched fashion.

In the above described pusher device, lead frames are pushed by the first pusher positioned at the rear area of the pusher device and fed forward to the magazine. Then, the lead frames are pushed by the second pusher so as to be completely fed into the magazine. When the lead frames accommodated in the magazine are to be fed out, they are fed out by the second pusher. In particular, after each lead frame has been fed forward by the first pusher, the pusher mount is withdrawn rearward so that the second pusher can face the rear end of the lead frame, and then the second pusher is moved so as to push the lead frame out of the magazine entirely.

Accordingly, the amount of movement of the pusher mount on which the first pusher and second pusher are provided is either the amount of movement required to feed the lead frames into the magazine or the amount of movement required to feed the lead frames out of the magazine, whichever amount of movement is larger. Thus, the amount of movement of the pusher mount is small, and therefore, the overall size of the pusher device can be small.

In the structure of the pusher device that includes the feeding roller means on the lead frame supply guide rails, the amount by which the lead frames are fed toward the magazine by the first pusher may be either the amount of movement required for the lead frame to reach the feeding roller means or the amount of movement required for the lead frames to be completely fed into the magazine by the second pusher, whichever amount of movement is larger. Accordingly, the amount of movement of the pusher mount that is required to feed the lead frames into the magazine may be reduced to an extremely small amount.

Furthermore, in the structure that includes the feeding roller means on the discharge guide rails, the amount by which the lead frames are fed out from the magazine by the second pusher may be the feeding amount required for the lead frame to reach the feeding roller means. Accordingly, the amount of movement of the pusher mount that is required to feed the lead frames out of the magazine may be reduced to an extremely small amount.

In addition, in the pusher device that includes the feeding roller means on the supply guide rails and on the discharge guide rails, the amount of movement required to feed lead frames into the magazine or to feed the lead frames out of the magazine can be reduced by an even greater amount. In this case, the amount of movement may be set as the amount of movement required to feed the lead frames into the magazine or as the amount of movement required to feed the lead frames out of the magazine, whichever amount of movement is greater.

BRIEF DESCRIPTION OF THE DRAWINGS

FIG. 3 illustrates the operation for accommodating the lead frames in the magazine.

FIG. 4 illustrates the operation for completely accommodating the lead frames in the magazine.

FIG. 5 illustrates the operation for feeding out the lead frames from the magazine.

DETAILED DESCRIPTION OF THE PREFERRED EMBODIMENTS

Figure 1:
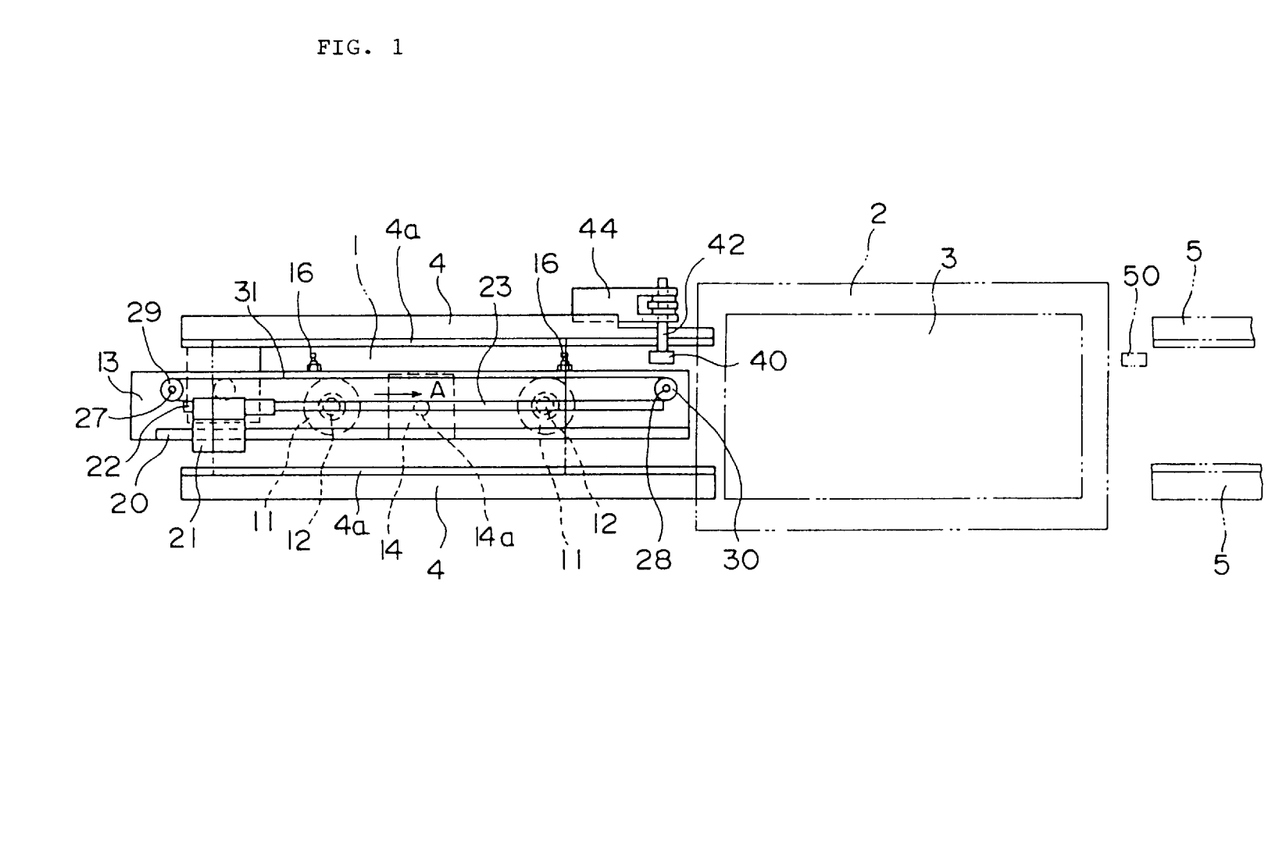
FIG. 1 is a top view which illustrates one embodiment of the lead frame pusher device of the present invention.
Figure 2:
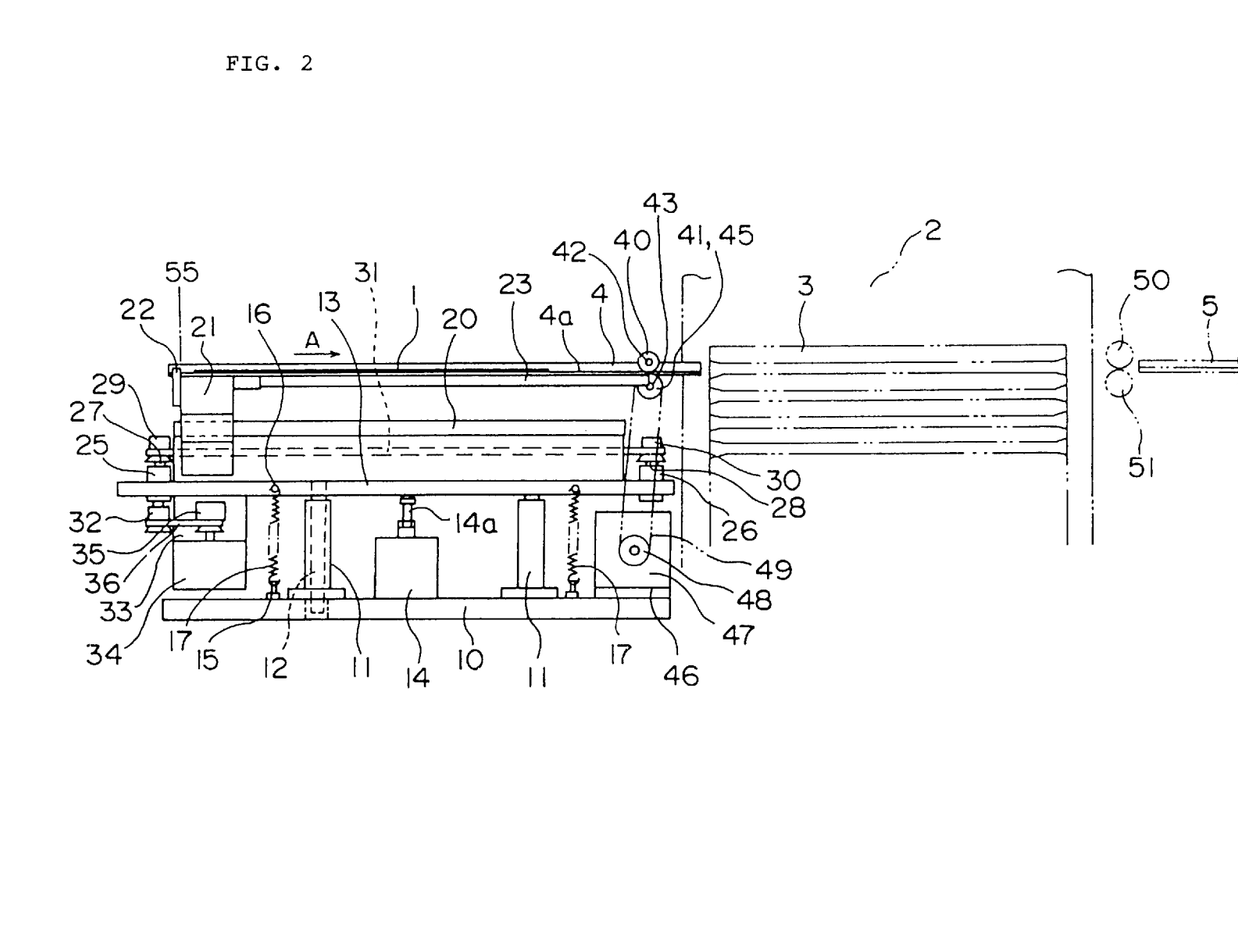
FIG. 2 is a front view of FIG. 1.

As shown in FIGS. 1 and 2, a lead frame magazine (merely called "magazine") 3 is installed inside a baking oven 2. The baking oven 2 bakes an insulating tape or adhesive agent that has been attached to lead frames 1, and the magazine 3 is mounted on the elevator of an elevator device (not shown).

A pair of supply guide rails 4 and a pair of discharge guide rails 5 which guide the lead frames 1 are respectively installed on the front side (left side in FIG. 1) and on the rear side (right side in FIG. 1) of the baking oven 2 and magazine 3. In other words, the supply guide rails 4 are provided in front of the oven 2 and magazine 3, and the discharge guide rails 5 are provided behind the oven 2 and magazine 3. Since this is a conventionally known structure, a further description is omitted.

Guide bushes 11 are provided on a base plate 10 which is located beneath the lead frame supply guide rails 4, and guide rods 12 are supported in the guide bushes 11 so that the guide rods 12 can move up and down (or in the perpendicular direction with reference to the surface of the drawing sheet).

A raising and lowering plate 13 is fastened to the upper ends of the guide rods 12. Springs 17 are provided between lower spring mounts 15 fixed to the base plate 10 and upper spring mounts 16 fixed to the raising and lower plate 13, so that the undersurface of the raising and lowering plate 13 is pressed against the operating rod 14a of a pusher raising and lowering cylinder 14.

A slide rail 20 which is positioned between and parallel to the pair of lead frame supply guide rails 4 is fastened to the raising and lowering plate 13, and a pusher mount 21 is slidably provided on this slide rail 20.

A first pusher 22, which is a pawl, as best seen in FIG. 2, projecting upward over the pusher mount 21 and a lead frame conveying path 4a of the lead frame supply guide rails 4, is provided on the pusher mount 21.

In addition, a second pusher 23, which is a rod extending horizontally toward the magazine 3 and below the upper end surface of the first pusher 22, is also provided on the pusher mount 21.

Bearings 25 and 26 are fastened to the raising and lowering plate 13 on the left and right sides, respectively, and pulley shafts 27 and 28 are rotatably supported on these bearings 25 and 26, respectively. Pulleys 29 and 30 are coupled to the upper end portions of the pulley shafts 27 and 28, respectively; and a belt 31 is provided between the pulleys 29 and 30. One end of the belt 31 is connected to the pusher mount 21.

In addition, the pulley shaft 27 extends downward so as to project from the bottom surface of the raising and lowering plate 13, and a pulley 32 is coupled to the lower end of the pulley shaft 27. A pusher feeding motor 34 is provided on the undersurface of the raising and lowering plate 13 so as to be near the pulley 32 via a supporting plate 33. A belt 36 is provided between the pulley 32 and a pulley 35 which is coupled to the output shaft of the pusher feeding motor 34.

A free-rolling roller 40 and a drive roller 41 (collectively called "feed-in rollers") which feed or convey lead frames 1 while sandwiching the lead frames 1 from above and below are provided at the forward end of the supply guide rails 4. Roller shafts 42 and 43 of the respective free-rolling roller 40 and drive roller 41 are rotatably provided on bearing holder 44 which is fastened to one of the supply guide rails 4; and a pulley 45 is also coupled to the roller shaft 43. A lead frame feeding motor 47 is provided, via a supporting plate 46, on the base plate 10 so as to be located beneath the pulley 45. A pulley 48 is coupled to the output shaft of the lead frame feeding motor 47, and a belt 49 is provided between the pulley 48 of the motor 47 and the pulley 45 of the roller shaft 43.

FIGS. 1 and 2 show the pusher mount 21 in a retracted state. In this case, the distance between the free-rolling roller 40 and the first pusher 22 is set to be sufficiently greater than the length of lead frames, and the tip end (or forward end, which is the left side end) of the second pusher 23 is located near the side of the free-rolling roller 40.

A free-rolling roller 50 and a drive roller 51 (collectively called "feed-out rollers") are provided on the discharge guide rails 5 so as to feed lead frames 1 while sandwiching the lead frames 1 from above and below. Though not shown in the Figures, the free-rolling roller 50 and drive roller 51 are driven by a structure substantially the same as that used for the feed-in rollers.

In operation, as shown in FIGS. 1 and 2, a lead frame 1 is first placed on the conveying path 4a of the supply guide rails 4 by a transfer device (not shown) with the second pusher 23 positioned below the conveying path 4a of the supply guide rails 4. Then, the pusher feeding motor 34 and lead frame feeding motor 47 are actuated in the forward direction.

When the pusher feeding motor 34 is thus actuated in the forward direction, the belt 31 rotates, and the point on the belt 31 to which the pusher mount 21 is attached is moved in the direction of arrow A via the pulley 35, belt 36 and pulley 32. As a result, the pusher mount 21 is moved along the slide rail 20 in the direction of arrow A, and the rear end of the lead frame 1 is pushed toward the magazine 3 by the first pusher 22 of the pusher mount 21. When the front end portion of the lead frame 1 is moved between and is sandwiched by the feed-in rollers comprising the free-rolling roller 40 and the drive roller 41, the pusher feeding motor 34 is rotated in the reverse direction.

At this point, the lead frame feeding motor 47 has been actuated and is rotated as described above; accordingly, this rotation of the lead frame feeding motor 47 causes the drive roller 41 to rotate in the direction of arrow B via the pulley 48, belt 49 and pulley 45. As a result, the rotating free-rolling roller 40 and drive roller 41, which sandwiches the lead frame 1, feed the lead frame 1 into the magazine 3 as shown in FIG. 3(b). When the pusher feeding motor 34 is rotated in the reverse direction as described above, the pusher mount 21 is moved in the opposite direction from the direction of arrow A, so that the pusher mount 21 returns to its initial position 55 as shown in FIG. 3(b).

As shown in FIG. 3(b) when the feed-in rollers (the free-rolling roller 40 and drive roller 41) have fed the lead frame 1 into the magazine 3, the rear end of the lead frame 1 is not completely inside the magazine 3. Accordingly, an operation which pushes the lead frame 1 completely inside the magazine 3 is commenced.

Figure 4A:
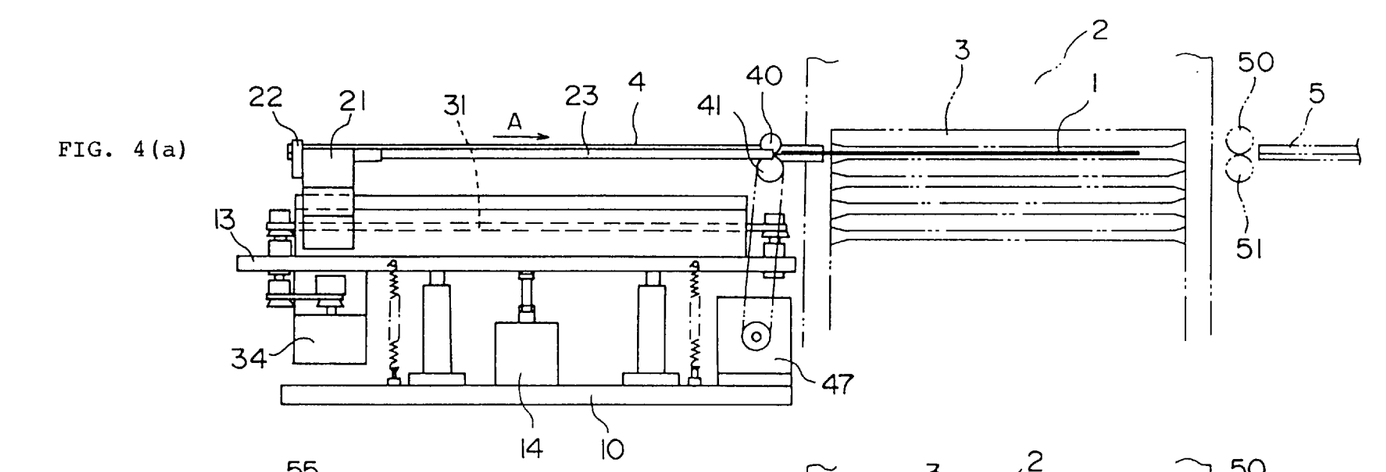
FIG. 4(a) shows the state prior to the operation of the second pusher.
Figure 4B:
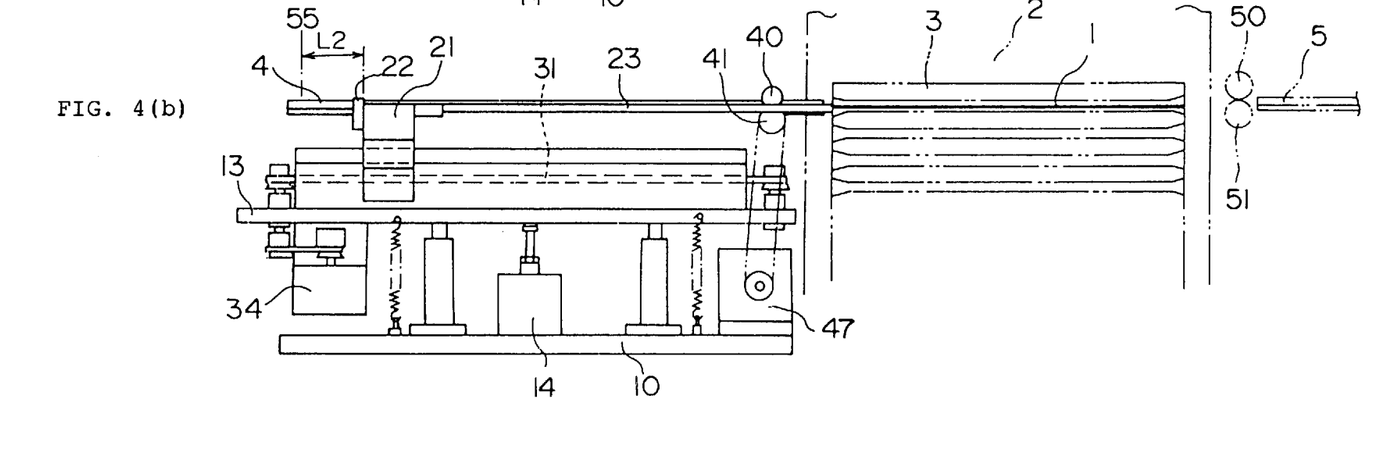
FIG. 4(b) shows the state following the operation of the second pusher.

More specifically, the pusher raising and lowering cylinder 14 is first operated so as to raise the operating rod 14a of the cylinder 14, thus moving the raising and lowering plate 13 upward. As a result, the center of the second pusher 23 is positioned at the height level of the conveying path 4a of the supply guide rails 4 as shown in FIG. 4(a). In other words, the leading (or forward) end of the second pusher 23 is brought behind the rear end of the lead frame 1. Then, the pusher feeding motor 34 is actuated again so as to rotate in the forward direction and move the pusher mount 21 in the direction of arrow A. As a result, the rear end of the lead frame 1 is pushed by the leading (or forward) end of the second pusher 23, and the lead frame 1 is completely pushed into the magazine 3 as shown in FIG. 4(b).

Afterward, the pusher feeding motor 34 is rotated in the reverse direction so that the pusher mount 21 is retracted. Also, the operating rod 14a of the pusher raising and lowering cylinder 14 is retracted so that the raising and lowering plate 13 is lowered, thus bringing the pusher device back to the state shown in FIGS. 1 and 2.

Once the lead frame 1 has been fed into the magazine 3, the magazine 3 is raised one pitch by the elevator device (not shown) so that the next lead frame accommodating section of the magazine is positioned at the level of the lead frame conveying path 4a. Then, when the next lead frame 1 is placed on the conveying path 4a of the supply guide rails 4, the lead frame 1 is fed into the magazine 3 by the series of operations as described above. Afterward, these series of operations are repeated until the magazine 3 is filled with lead frames.

During the operation in which the lead frames 1 are fed into the magazine 3, the insulating tapes bonded to the lead frames 1 are successively pre-baked by the heated atmosphere provided by the baking oven 2 starting with the lead frame which was first fed into the magazine 3. When the feeding of the lead frames 1 into the magazine is completed, the elevator device is operated in the opposite direction from that described above so that the first lead frame accommodating section of the magazine 3 is brought to the level of the conveying path 4a.

Figure 5A:
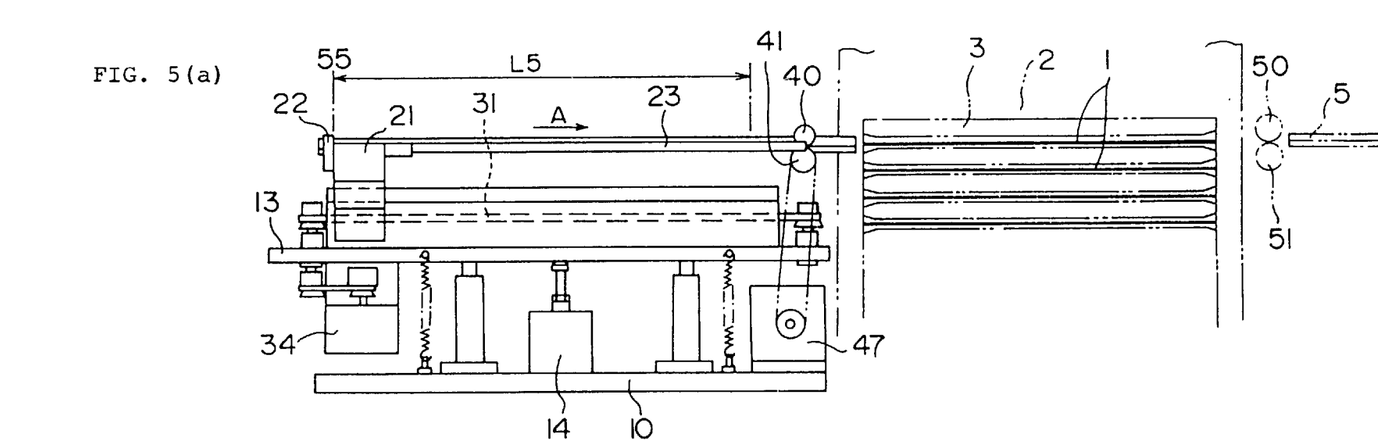
FIG. 5(a) shows the state prior to the operation of the second pusher.

When the feed-in operation of the magazine 3 has been completed as described above, the operating rod 14a of the pusher raising and lowering cylinder 14 is protruded so that the raising and lowering plate 13 is moved upward, thus causing the second pusher 23 to be positioned at the height level of the conveying path as shown in FIG. 5(a) so that the lead frames are fed out of the magazine 3.

Figure 5B:
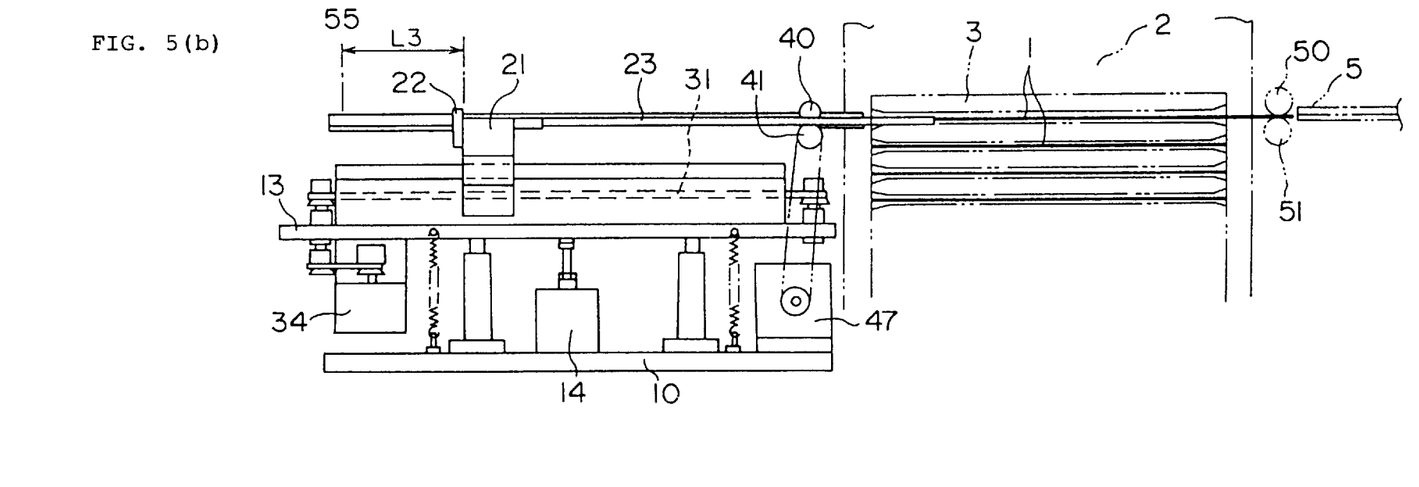
FIG. 5(b) shows the state following the operation of the second pusher.

In particular, the pusher feeding motor 34 is actuated so as to rotate in the forward direction so that the second pusher 23 is moved in the direction of arrow A and pushes the rear end of the corresponding lead frame 1 accommodated in the magazine 3. As a result, the front end portion of the lead frame 1 is sandwiched by the feed-out rollers comprising the free-rolling roller 50 and drive roller 51 as shown in FIG. 5(b). Then, this lead frame 1 is fed out onto the discharge guide rails 5 by the rotation of the free-rolling roller 50 and drive roller 51. After this, the pusher feeding motor 34 is rotated in the reverse direction so as to return to the position shown in FIG. 5(a) and FIG. 2.

Then, an operation is performed in which a new lead frame 1 is fed into the now empty first lead frame accommodating section of the magazine 3. More specifically, a new lead frame 1 is placed on the supply guide rails 4 as described above, and the first and second pushers 22 and 23 are operated as described above so that the lead frame 1 is fed into the empty first lead frame accommodating section of the magazine 3. The magazine 3 is raised one pitch so that the next lead frame accommodating section is positioned at the level of the lead frame conveying path. Then, the pusher feeding motor 34 is again rotated in the forward direction so that the second pusher 23 pushes out the lead frame 1 located inside the magazine 3 until the front end portion of the lead frame 1 is sandwiched by the free-rolling roller 50 and drive roller 51. Afterward, another lead frame is fed into the empty second lead frame accommodating section of the magazine 3, and these series of operations are successively repeated.

Figure 3A:
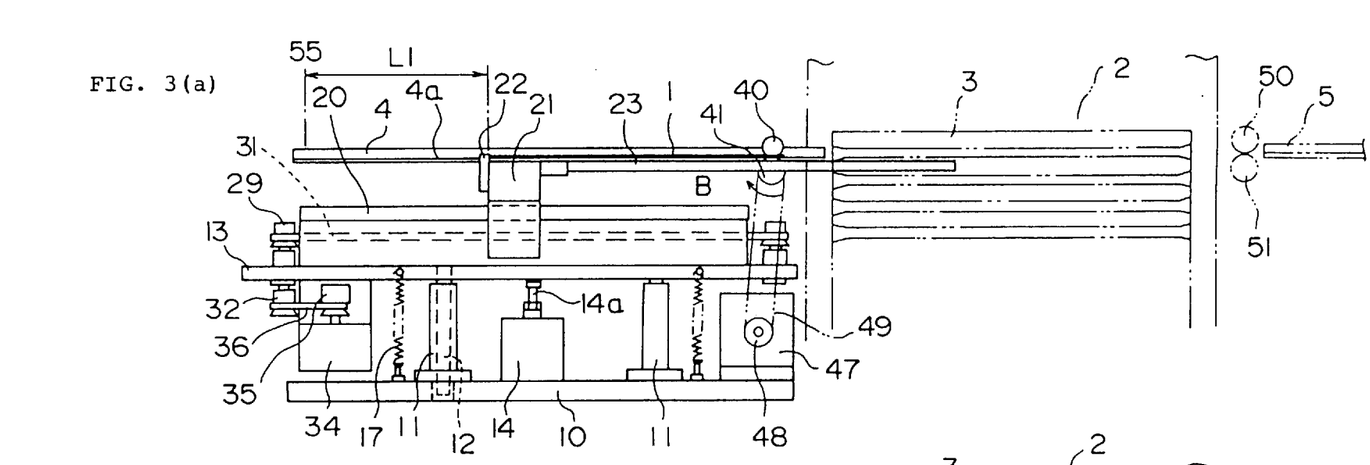
FIG. 3(a) shows the feeding of lead frames by the first pusher.
Figure 3B:
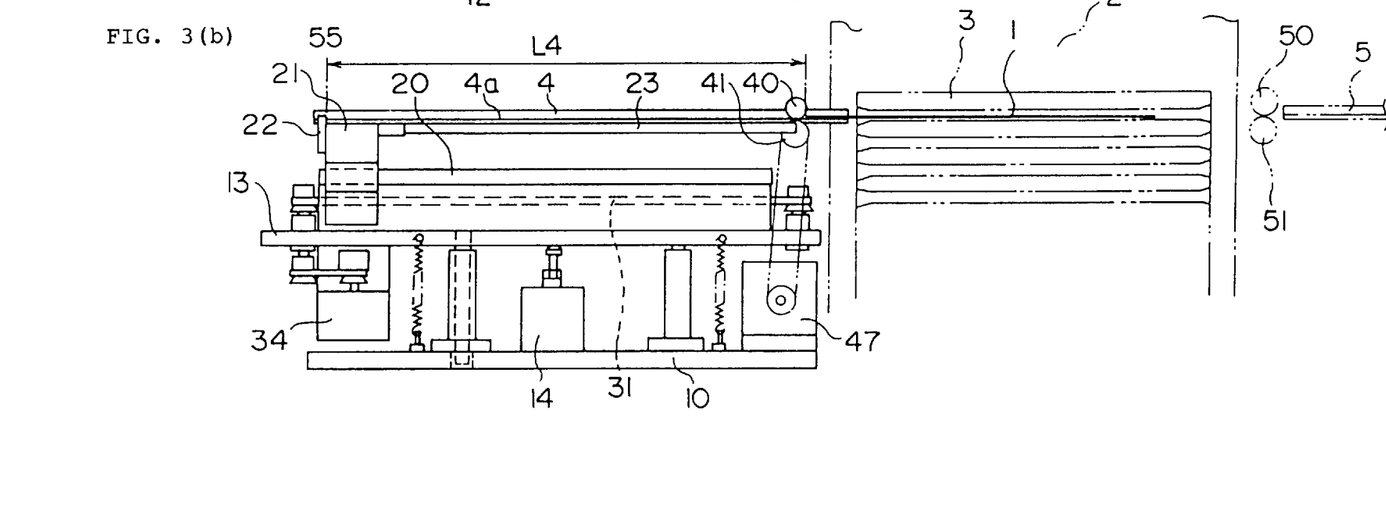
FIG. 3(b) shows the feeding of lead frames by the feeding roller means.

As seen from the above, the pusher mount 21 operates so that each lead frame is pushed by the first pusher 22, which is at the rear end area of the pusher device, from the position shown in FIGS. 1 and 2 until the front end of the lead frame 1 is sandwiched by the free-rolling roller 40 and drive roller 41 as shown in FIG. 3(a). In other words, the pusher mount 21 only moves a distance of L1 from the initial position 55, and then the lead frame 1 is almost completely fed into the magazine 3 by the free-rolling roller 40 and drive roller 41 (Thus, L1 refers to the distance in which the pusher mount 21 moves from the initial position 55 so that the first pusher 22 pushes the lead frame until the forward end of the lead frame comes into the feed-in rollers). Afterward, as shown in FIGS. 4(a) and 4(b), the pusher mount 21 is moved a distance of L2 from the initial position 55; in other words, the second pusher 23 on the pusher mount 21 is moved a distance of L2, so that the lead frame 1 is completely fed into the magazine 3 (Thus, L2 refers to the distance in which the pusher mount 21 moves from the initial position 55 so that the second pusher 23 pushes the lead frame until the lead frame is completely fed into the magazine 3).

As seen from the above, the maximum amount of movement of the pusher mount 21 that is required to feed a lead frame placed on the conveying path 4a of the supply guide rails 4 into the magazine 3 is an amount of movement that corresponds to the distance L1 or L2, whichever is longer. Furthermore, in regard to the amount of movement of the pusher mount 21 that is required to feed out a lead frame accommodated in the magazine 3 onto the discharge guide rails 5, the pusher mount 21 is moved only a distance of L3 from the initial position 55 so that the front end portion of the lead frame 1 is sandwiched and fed out by the free-rolling roller 50 and drive roller 51 as shown in FIGS. 5(a) and 5(b) (Thus, L3 refers to the distance in which the pusher mount 21 moves from the initial position 55 so that the second pusher 23 pushes the lead frame accommodated inside the magazine 3 until the forward end of the lead frame comes into the feed-out rollers).

In FIG. 2, the distance between the leading or forward end of the lead frame 1 and the free-rolling roller 40 or drive roller 41 is shown as an extremely large distance; accordingly, the respective movement distances shown in FIGS. 3(a), 4(b) and 5(b) are L1>L3 >L2. However, by setting the pusher mount 21 to be at an advanced position beforehand in accordance with the length of the lead frame to be handled, the distance between the leading end of the lead frame and the free-rolling roller 40 can be extremely small. In other words, L1 can be shorter than L3, so that L3 is longer than L1 or L2. Accordingly, a movement of the pusher mount 21 within the range of L3 can feed the lead frame placed on the supply guide rails 4 into the magazine 3 and feed out the lead frame onto the discharge guide rails 5. Thus, the pusher mount 21 is required to move only a short distance from the initial position 55, i. e., the first pusher 22 and second pusher 23 are required to move an extremely short distance. Accordingly, the size of the pusher device can be minimized.

The pusher device described above includes the feed-in rollers comprising the free-rolling roller 40 and drive roller 41 as well as the feed-out rollers comprising the free-rolling roller 50 and drive roller 51. However, the pusher device of the present invention can be designed smaller in size compared to a conventional device even though (1) the free-rolling roller 40 and drive roller 41 are omitted, (2) the free-rolling roller 50 and drive roller 51 are omitted, or (3) both sets of rollers are omitted, as described below. (1) A case in which the feed-in rollers (the free-rolling roller 40 and drive roller 41) are omitted, and only the feed-out rollers (the free-rolling roller 50 and drive roller 51) are installed, is described first:

When a lead frame 1 placed on the supply guide rails 4 as shown in FIG. 1 and 2 is going to be pushed into the magazine 3 almost entirely as shown in FIG. 3(b), the rear end of the lead frame 1 is pushed by the first pusher 22 until the lead frame 1 assumes the position shown in FIG. 3(b). In this case, the pusher mount 21 is moved a distance of L4 from the initial position 55 (Thus, L4 refers to the distance in which the pusher mount 21 moves from the initial position 55 so that the first pusher 22 pushes the lead frame until the lead frame is fed into the magazine 3 except for the rear end area thereof as shown in FIG. 3(b)). Next, in order to push the lead frame 1 as shown in FIG. 3(b) into the magazine 3 completely, the pusher mount 21 is moved a distance equivalent to L2 from the initial position 55 as in the aforementioned embodiment (this is illustrated in FIGS. 4(a) and 4(b)).

Since L4 is larger than L2, the lead frame 1 on the supply guide rails 4 can be completely pushed into the magazine 3 by the pusher mount 21 which is moved a distance of L4.

Furthermore, a lead frame 1 inside the magazine 3 can be fed out onto the discharge guide rails 5 by causing the pusher mount 21 to move a distance equivalent to L3 from the initial position 55 as described above. In other words, since L4 is longer than L3, the maximum distance that the pusher mount 21 must be moved so as to feed a lead frame placed on the supply guide rails 4 into the magazine 3 or to feed out a lead frame 1 accommodated in the magazine 3 onto the discharge guide rails 5 is L4.

(2) In the case where the free-rolling roller 40 and drive roller 41 are installed, and the free-rolling roller 50 and drive roller 51 are omitted, the pusher mount 21 is operated in the following manner:

The maximum amount of movement of the pusher mount 21 that is required to achieve a complete push-in of a lead frame placed on the supply guide rails 4 into the magazine 3 is either L1 or L2, whichever is greater, from the initial position 55 as described above.

Furthermore, when a lead frame 1 inside the magazine 3 is to be fed out onto the discharge guide rails 5, the lead frame 1 is fed out by the second pusher 23. Accordingly, the second pusher 23 can move only a distance of L5 from the initial position 55 (Thus, L5 refers to the distance in which the pusher mount 21 moves from the initial position 55 so that the second pusher 23 pushes the lead frame accommodated in the magazine 3 until the lead frame is fed on the discharge guide rails 5).

In other words, since L5 is longer than L1 or L2, the maximum amount of movement of the pusher mount that is required to feed the lead frame placed on the supply guide rails 4 into the magazine 3 or to feed out the lead frame accommodated inside the magazine 3 onto the discharge guide rails 5, is within the range of distance L5.

(3) In the case where the free-rolling roller 40 and drive roller 41, as well as the free-rolling roller 50 and drive roller 51, are not provided, the pusher mount 21 is operated in the following manner:

The amount of movement of the pusher mount that is required to achieve a complete push-in of a lead frame placed on the supply guide rails 4 into the magazine 3 is within the range of L4 from the initial position 55.

Also, the amount of movement of the pusher mount 21 that is required to feed out a lead frame accommodated in the magazine 3 onto the discharge guide rails 5 is within the range of L5 from the initial position 55.

In other words, the amount of movement of the pusher mount 21 may be within the range of L4 or L5, whichever is greater.

In conventional devices, it is necessary for a slider element to which the pusher is attached to move a distance equal to L4 plus L5 so as to push a lead frame placed on the supply guide rails 4 into the magazine 3 or to feed out a lead frame accommodated in the magazine 3 onto the discharge guide rails 5. In the present invention, even in cases where the free-rolling roller 40 and drive roller 41 or the free-rolling roller 50 and drive roller 51 (or both sets of rollers) are omitted, the required amount of movement of the pusher mount 21 is either L4 or L5, whichever is larger, i. e., an amount of movement that is approximately half that required in a conventional device. Accordingly, the size of the pusher device can be reduced.

Furthermore, in cases where the free-rolling roller 40 and drive roller 41 and the free-rolling roller 50 and drive roller 51 are all provided, the required amount of movement of the pusher mount 21 is the short distance L3; accordingly, the size of the device can be reduced even further.

In the above embodiment, the feed-in rollers are provided on one of the pair of the lead frame supply guide rails 4. However, this invention is applicable to a structure in which each one of the pair of the lead frame supply rails 4 is provided with feed-in rollers. Likewise, feed-out rollers can be provided on both of the pair of the lead frame discharge guide rails 5.

As described in detail above, the lead frame pusher device of the present invention includes:

a pusher mount which is installed between the supply guide rails so that the pusher mount can move along the supply guide rails, a pusher mount driving means which drives the pusher mount along the supply guide rails, a first pusher which is fastened to the pusher mount so as to project upward from the pusher mount, a second pusher which is fastened to the pusher mount so as to be below the first pusher and extends toward the magazine, and a pusher raising and lowering driving means which drives the pusher mount up and down so that the first and second pushers are positioned at the conveying path level of the supply guide rails.

Accordingly, the overall size of the pusher device can be minimized, and the movement time of the pusher can be shortened.

We claim:

1. A lead frame pusher device comprising: a pair of supply guide rails and a pair of discharge guide rails installed respectively on a front and a rear side of a magazine, which is raised and lowered by an elevator means, so that lead frames are fed into and fed out of said magazine via said guide rails, said lead frame pusher device further comprising:

a pusher mount installed between said pair of supply guide rails for being moved along said supply guide rails, a pusher mount driving means for driving said pusher mount along said supply guide rails, a first pusher means provided on said pusher mount and projecting upward from said pusher mount for coming into contact with said lead frames, a second pusher means provided on said pusher mount and extending toward said magazine below said first pusher means for coming into contact with said lead frames, and a means for raising and lowering said pusher mount which moves said pusher mount upward and downward so that said first and second pusher means are alternately positioned at a conveying path level of said pair of supply guide rails.

2. A lead frame pusher device according to claim 1, further comprising a feed-in roller means provided on one of said pair of supply guide rails for sandwiching and feeding said lead frames into said magazine.

3. A lead frame pusher device according to claim 1, further comprising a feed-out roller means provided on one of said pair of discharge guide rails for sandwiching and feeding said lead frames out of said magazine.

4. A lead frame pusher device according to claim 1, further comprising feed-in roller means and feed-out roller means respectively provided on said pair of supply guide rails and on said pair of discharge guide rails for sandwiching and feeding said lead frames.

5. A lead frame pusher device for feeding lead frames into a lead frame magazine comprising:

a pair of lead frame supply guide rails extending in a first direction, a pusher mount provided between said pair of supply guide rails for reciprocating in said first direction, a pusher mount driving means for reciprocating said pusher mount in said first direction, a first pusher means provided on said pusher mount for coming into contact with said lead frames and moving said lead frames toward said lead frame magazine, a second pusher means provided on said pusher mount for coming into contact with said lead frames and feeding said lead frames into said lead frame magazine, and a means for moving said pusher mount in a second direction which is perpendicular to said first direction so that one of said first pusher means and said second pusher means alternately comes into contact with said lead frame when said pusher mount moves toward said lead frame magazine.

6. A lead frame pusher device according to claim 5, wherein said second pusher means extends in said first direction, being larger in size than said first pusher means in said first direction.

7. A lead frame pusher device according to claim 5, further comprising a pair of lead frame discharge guide rails provided opposite from said lead frame supply guide rails with said magazine in between.

8. A lead frame pusher device according to claim 5, further comprising feed-in roller means provided on said lead frame supply guide rails for conveying said lead frames.

9. A lead frame pusher device according to claim 7, further comprising feed-out roller means provided on said lead frame discharge guide rails for conveying said lead frames.

10. A lead frame pusher device according to claim 7, further comprising feed-in roller means and feed-out roller means which are respectively provided on said lead frame supply guide rails and on said lead frame discharge guide rails for conveying said lead frames.

* * * * *